(12) United States Patent
Cabanillas et al.

(10) Patent No.: US 9,692,392 B2
(45) Date of Patent: Jun. 27, 2017

(54) FILTERS FOR MULTI-BAND WIRELESS DEVICE

(71) Applicant: QUALCOMM Incorporated, San Diego, CA (US)

(72) Inventors: Jose Cabanillas, San Diego, CA (US); Aristotele Hadjichristos, San Diego, CA (US); Per O Kristensen, Ocean Township, NJ (US); Mohan V Puntambekar, Branchburg, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 109 days.

(21) Appl. No.: 13/653,030

(22) Filed: Oct. 16, 2012

(65) Prior Publication Data

US 2014/0073267 A1 Mar. 13, 2014

Related U.S. Application Data (60) Provisional application No. 61/699,574, filed on Sep. 11, 2012.

(51) Int. Cl.
*H04B 1/44* (2006.01)
*H03H 11/34* (2006.01)
(Continued)

(52) U.S. Cl.
CPC .......... *H03H 11/344* (2013.01); *H03H 7/465* (2013.01); *H04B 1/0458* (2013.01);
(Continued)

(58) Field of Classification Search
USPC ........... 455/78–83, 552.1, 553.1, 103, 114.1, 455/114.2
See application file for complete search history.

(56) References Cited

U.S. PATENT DOCUMENTS 4,085,405 A 4/1978 Barlow
5,361,403 A * 11/1994 Dent .................. H03F 1/56
330/129

(Continued)

FOREIGN PATENT DOCUMENTS

| CN | 102420686 A | 4/2012 |
| CN | 102523012 A | 6/2012 |
| EP | 2178219 A1 | 4/2010 |

OTHER PUBLICATIONS

International Search Report and Written Opinion—PCT/US2013/059309—ISA/EPO—Nov. 4, 2013.

*Primary Examiner* — Tuan A Tran
(74) *Attorney, Agent, or Firm* — Liberty E. Mann (57) ABSTRACT

Techniques to implement a filter for a selected signal path by reusing a circuit component in an unselected signal path are disclosed. In an exemplary design, an apparatus includes first, second, and third circuits. The first circuit passes a first radio frequency (RF) signal to an antenna when a first signal path is selected. The second circuit passes a second RF signal to the antenna when a second signal path is selected. The third circuit is selectively coupled to the first circuit, e.g., via a switch. The first and third circuits form a filter for the second RF signal (e.g., to attenuate a harmonic of the second RF signal) when the second signal path is selected and the first signal path is unselected. The first circuit may include a series inductor, and the third circuit may include a shunt capacitor.

20 Claims, 10 Drawing Sheets

(51) Int. Cl.
- H03H 7/46 (2006.01)
- H04B 1/04 (2006.01)
- *H01P 1/213* (2006.01)
- *H03H 11/30* (2006.01)
- *H03H 7/38* (2006.01)

(52) U.S. Cl.
CPC .............. *H01P 1/213* (2013.01); *H03H 11/30* (2013.01); *H03H 2007/386* (2013.01)

(56) References Cited

U.S. PATENT DOCUMENTS

| | | | |
|---|---|---|---|
| 6,298,244 B1* | 10/2001 | Boesch et al. | 455/553.1 |
| 6,366,788 B1* | 4/2002 | Fujioka et al. | 455/553.1 |
| 6,865,399 B2* | 3/2005 | Fujioka et al. | 455/553.1 |
| 7,221,225 B2* | 5/2007 | Ichitsubo et al. | 330/279 |
| 7,239,853 B2* | 7/2007 | Kearns | H04B 1/005 333/101 |
| 7,307,494 B2* | 12/2007 | Erb | H04B 1/0458 333/126 |
| 7,333,831 B2* | 2/2008 | Srinivasan | H04B 1/006 330/295 |
| 7,577,404 B2* | 8/2009 | Hayashi | H01P 1/15 455/561 |
| 7,740,729 B1* | 6/2010 | Fan et al. | 156/272.2 |
| 7,808,342 B2* | 10/2010 | Prikhodko | H03H 7/0115 333/103 |
| 7,885,613 B2 | 2/2011 | Kemmochi et al. | |
| 8,134,409 B2* | 3/2012 | Seki | H03F 1/0205 330/124 R |
| 8,644,197 B2* | 2/2014 | Lee | H01Q 9/40 340/572.7 |
| 2008/0119214 A1 | 5/2008 | Liu et al. | |
| 2008/0242344 A1* | 10/2008 | Maeda | H04B 1/1036 455/552.1 |
| 2009/0081979 A1 | 3/2009 | Wilhelm et al. | |
| 2009/0295501 A1 | 12/2009 | Hayashi et al. | |
| 2010/0291888 A1* | 11/2010 | Hadjichristos | H03F 1/0277 455/127.4 |
| 2011/0001566 A1* | 1/2011 | Seki | H03F 1/0205 330/295 |
| 2011/0254753 A1 | 10/2011 | Ozone et al. | |
| 2012/0147789 A1 | 6/2012 | Bremer et al. | |
| 2012/0202561 A1 | 8/2012 | Robinett | |

* cited by examiner

FILTERS FOR MULTI-BAND WIRELESS DEVICE

CLAIM OF PRIORITY UNDER 35 U.S.C. §119

The present Application for Patent claims priority to Provisional U.S. Application Ser. No. 61/699,574, entitled "FILTERS FOR MULTI-BAND WIRELESS DEVICE," filed Sep. 11, 2012, assigned to the assignee hereof, and expressly incorporated herein by reference.

BACKGROUND

I. Field

The present disclosure relates generally to electronics, and more specifically to filters for a wireless device.

II. Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated RF signal, amplify the modulated RF signal to obtain an output RF signal having the proper transmit power level, and transmit the output RF signal via an antenna to a base station. For data reception, the receiver may obtain a received RF signal via the antenna and may condition and process the received RF signal to recover data sent by the base station.

A wireless device may be required to meet various performance requirements. For example, a transmitter within the wireless device may be required to meet stringent harmonic rejection requirements at an antenna connector, which means that harmonics of an output RF signal should be below a specified level. A large portion of the transmitter may be implemented on an integrated circuit (IC) chip, and it may be challenging to achieve the required level of harmonic rejection on-chip. Hence, passive circuit components such as inductor and capacitor (LC) traps and/or diplexers may be placed on a printed circuit board (PCB) at or near the antenna connector to reduce the harmonic level. However, the LC traps and/or diplexers would increase the size and cost of the wireless device. Furthermore, the wireless device may support many frequency bands and may require harmonic traps for different bands and/or different harmonics of each band. A large number of circuit components may be needed to implement all of the required harmonic traps on the PCB, which may greatly increase the size and cost of the wireless device.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Filters to reduce harmonic level and implemented with fewer circuit components are disclosed herein. These filters may provide various advantages and may be used for various types of electronic devices such as wireless communication devices. These filters may be especially suitable for wireless devices supporting multiple bands and/or multiple radio technologies.

Figure 1:
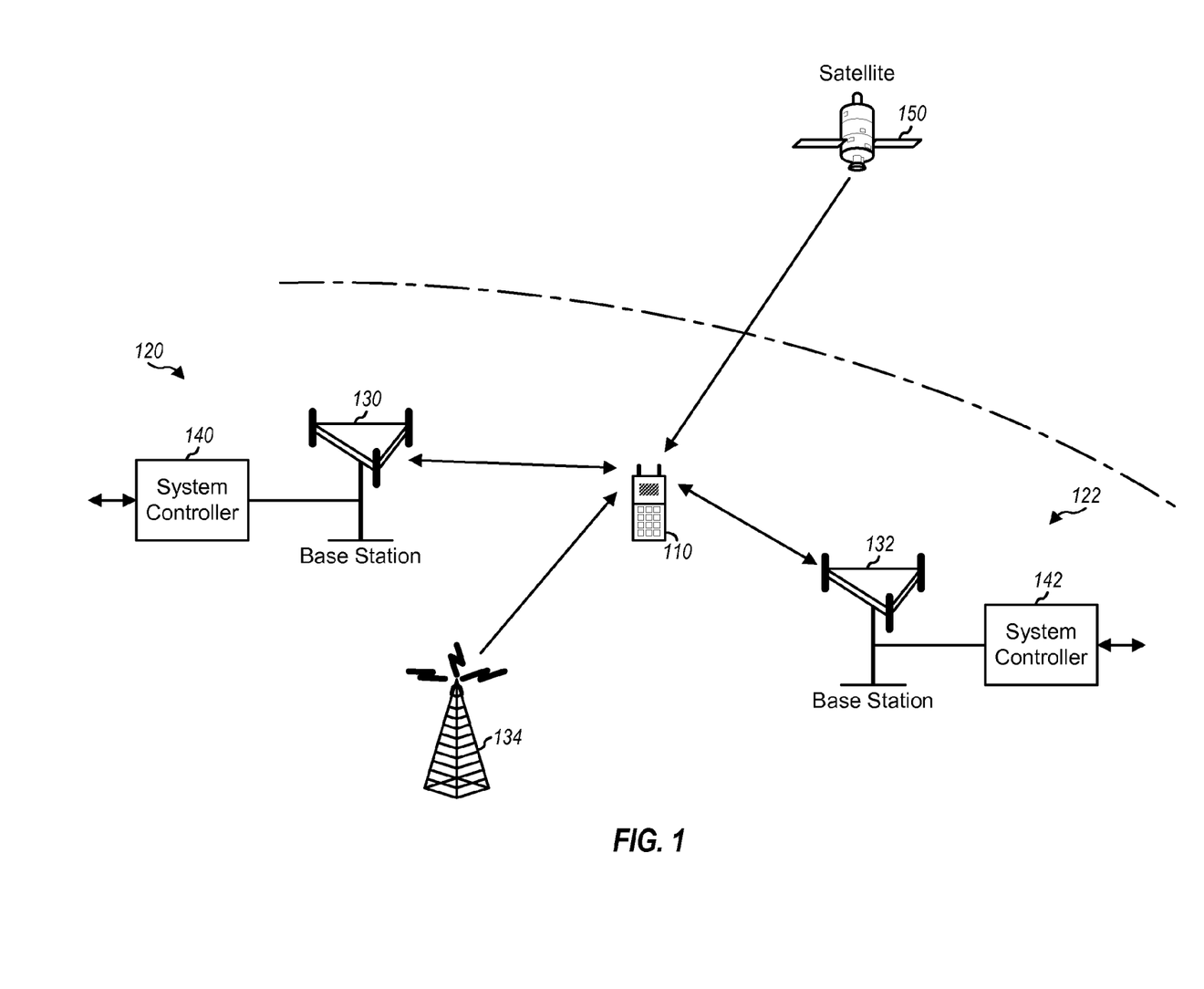
FIG. 1 shows a wireless device communicating with different wireless systems.

FIG. 1 shows a wireless device 110 capable of communicating with different wireless communication systems 120 and 122. Wireless systems 120 and 122 may each be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Time Division Synchronous CDMA (TD-SCDMA), or some other version of CDMA. For simplicity, FIG. 1 shows wireless system 120 including one base station 130 and one system controller 140, and wireless system 122 including one base station 132 and one system controller 142. In general, each wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may be capable of communicating with wireless system 120 and/or 122. Wireless device 110 may also be capable of receiving signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, TD-SCDMA, GSM, IEEE 802.11, etc.

Wireless device 110 may be able to operate in low-band (LB) from 698 to 960 megahertz (MHz), mid-band (MB) from 1475 to 2170 MHz, and/or high-band (HB) from 2300 to 2690 and 3400 to 3800 MHz. Low-band, mid-band, and high-band refer to three groups of bands (or band groups), with each band group including a number of frequency bands (or simply, "bands"). Each band may cover up to 200 MHz. LTE Release 11 supports 35 bands, which are referred to as LTE/UMTS bands and are listed in 3GPP TS 36.101. In general, wireless device 110 may support any number of band groups and any one of the band groups. Wireless device 110 may also support any number of bands within each supported band group.

Figure 2:
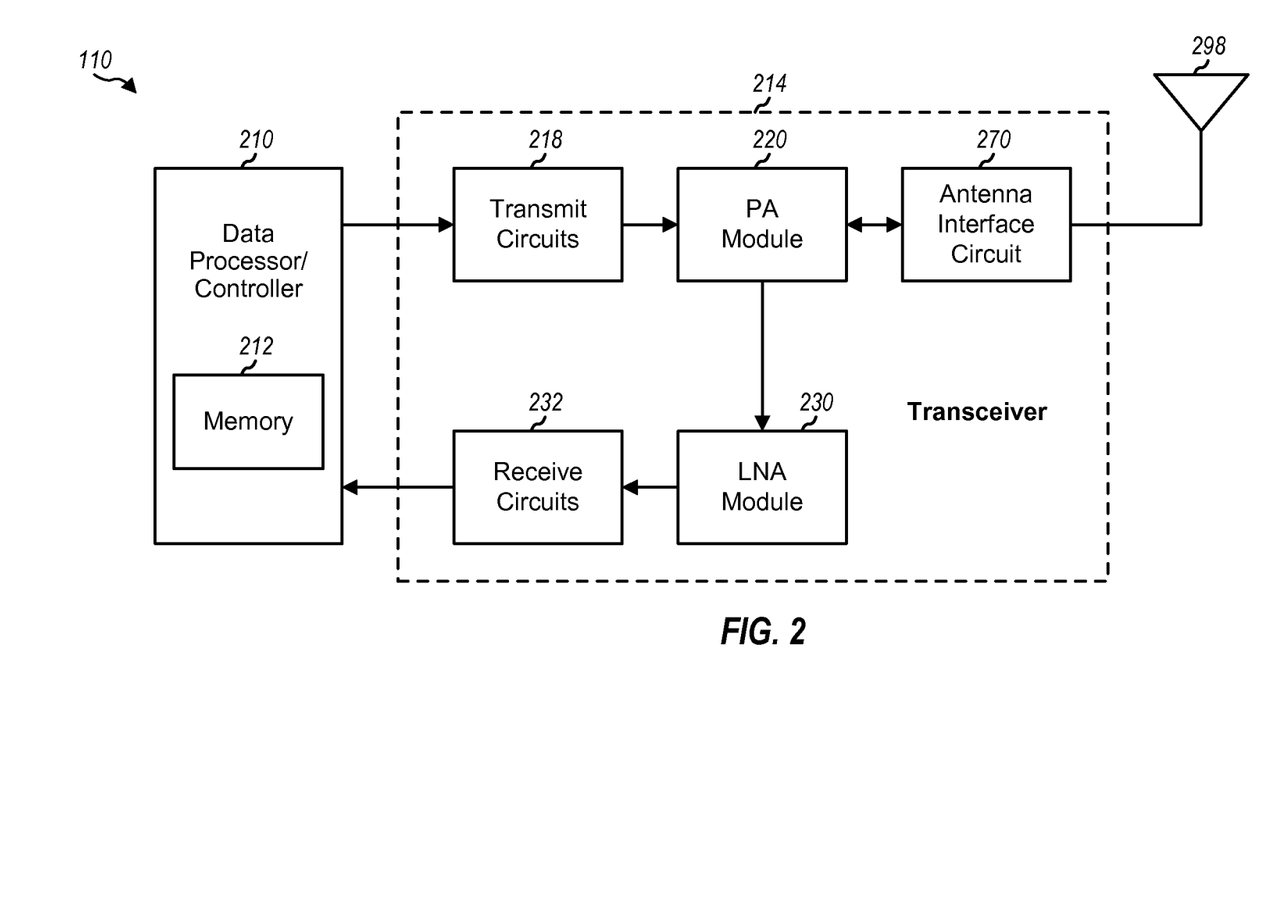
FIG. 2 shows a block diagram of the wireless device in FIG. 1.

FIG. 2 shows a block diagram of an exemplary design of wireless device 110 in FIG. 1. In this exemplary design, wireless device 110 includes a data processor/controller 210 and a transceiver 214 coupled to an antenna 298. Transceiver 214 includes transmit circuits 218, a power amplifier (PA) module 220, an antenna interface circuit 270, a low noise amplifier (LNA) module 230, and receive circuits 232. A PA module may also be referred to as a front-end module, etc. In general, a wireless device may include any number of transmitters and any number of receivers for any number of antennas, any number of bands, and any number of radio technologies.

For data transmission, data processor 210 processes (e.g., encodes and modulates) data to be transmitted and provides an analog output signal to transceiver 214. Within transceiver 214, transmit circuits 218 amplify, filter, and upconvert the analog output signal from baseband to RF and provide a modulated RF signal to PA module 220. Transmit circuits 218 may include amplifiers, filters, mixers, matching circuits, oscillators, local oscillator (LO) generators, phase-locked loops (PLLs), etc. PA module 220 amplifies the modulated RF signal and provides an output RF signal having the proper transmit power level. PA module 220 may include PAs, filters, matching circuits, switches, etc. The output RF signal is routed through antenna interface circuit 270 and transmitted via antenna 298. Antenna interface circuit 270 may include matching circuits, filters, duplexers, diplexers, switches, directional couplers, etc.

For data reception, antenna 298 receives signals from base stations and/or other transmitter stations and provides a received RF signal. The received RF signal may be routed through antenna interface circuit 270 and PA module 220 and provided to LNA module 230, as shown in FIG. 2. Alternatively, the received RF signal may be routed through antenna interface circuit 270 and provided to LNA module 230 (not shown in FIG. 2). In any case, LNA module 230 amplifies the received RF signal and provides an amplified RF signal. Receive circuits 232 downconvert the amplified RF signal from RF to baseband, amplify and filter the downconverted signal, and provide an analog input signal to data processor 210. Receive circuits 232 may include mixers, filters, amplifiers, matching circuits, oscillators, LO generators, PLLs, etc.

FIG. 2 shows an exemplary design of transceiver 214. A transceiver may also include other circuits not shown in FIG. 2, such as filters, matching circuits, etc. All or a portion of transceiver 214 may be implemented on one or more analog integrated circuits (ICs), RF ICs (RFICs), mixed-signal ICs, etc. For example, transmit circuits 218, PA module 220, LNA module 230, and receive circuits 232 may be implemented on one module, which may be an RFIC, etc. Antenna interface circuits 270 may be implemented on another module, which may be a hybrid module, etc. The circuits in transceiver 214 may also be implemented in other manners.

Data processor/controller 210 may perform various functions for wireless device 110. For example, data processor 210 may perform processing for data being transmitted and data being received via transceiver 214. Controller 210 may control the operation of transmit circuits 218, PA module 220, LNA module 230, receive circuits 232, antenna interface circuit 270, or a combination thereof. A memory 212 may store program codes and data for data processor/controller 210. Data processor/controller 210 may be implemented on one or more application specific integrated circuits (ASICs) and/or other ICs.

PA module 220 and antenna interface circuit 270 may be implemented in various manners. Some exemplary designs of PA module 220 and antenna interface circuit 270 are described below.

Figure 3:
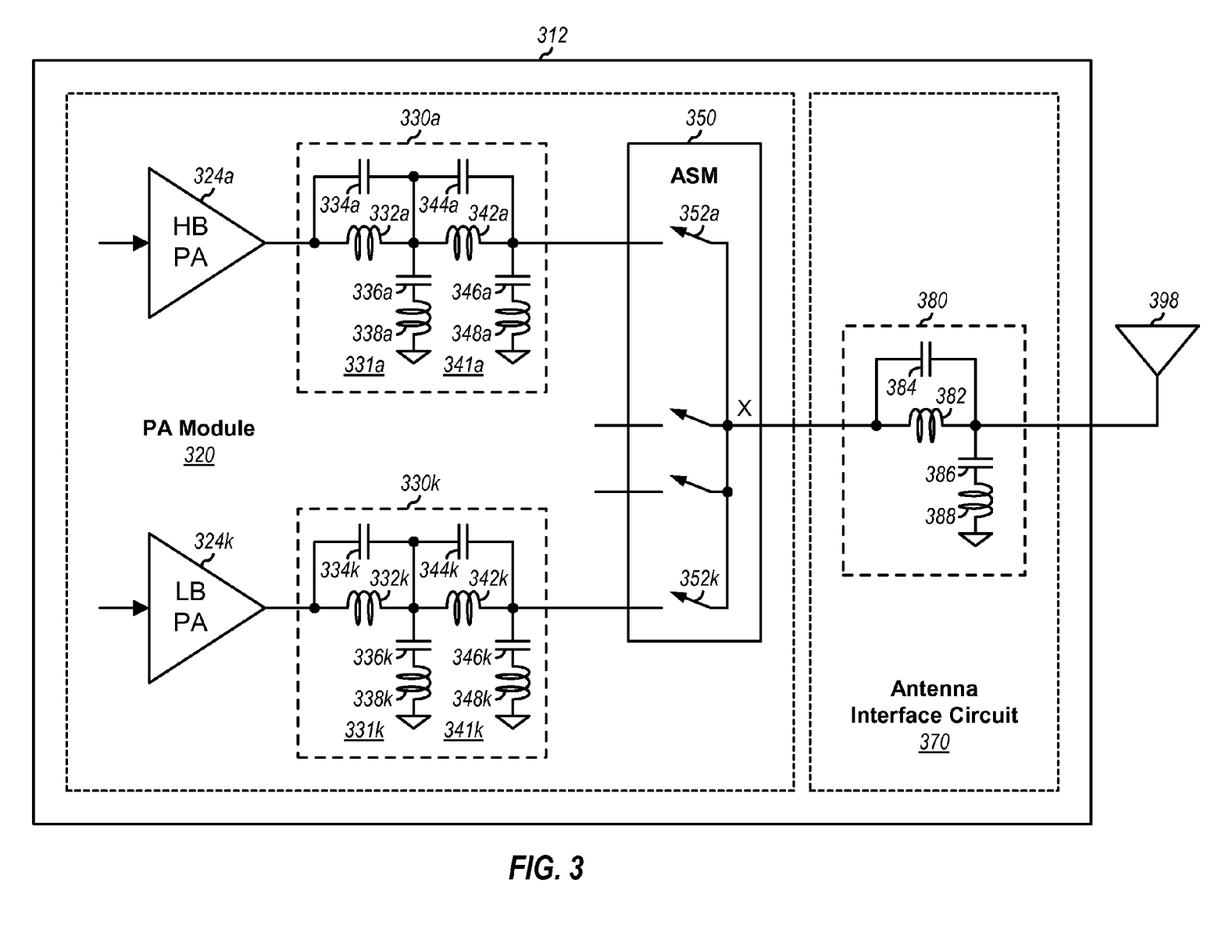
FIG. 3 show a power amplifier (PA) module and an antenna interface circuit.

FIG. 3 shows a PA module 320 and an antenna interface circuit 370, which are one exemplary design of PA module 220 and antenna interface circuit 270 in FIG. 2. For simplicity, FIG. 3 shows PA module 320 including one PA 324a for high-band (HB) and one PA 324k for low-band (LB) for a particular radio technology (e.g., LTE or GSM). PA module 320 may also include additional PAs to supported additional bands, radio technologies, and/or antennas.

In the exemplary design shown in FIG. 3, PA module 320 includes a filter and matching circuit 330 for each PA 324 as well as an antenna switch matrix (ASM) 350. An ASM may also be referred to as a switchplexer, switches, etc. A filter and matching circuit may also be referred to as a filter, a matching circuit, an output circuit, etc. Filter and matching circuit 330a is coupled between the output of HB PA 324a and ASM 350. Filter and matching circuit 330k is coupled between the output of LB PA 324k and ASM 350. Antenna interface circuit 370 includes a filter and matching circuit 380 coupled between ASM 350 and an antenna 398.

PA 324a or 324k may be selected at any given moment. PA 324a may be selected to amplify a first input RF signal for high-band and provide a first output RF signal. Alternatively, PA 324k may be selected to amplify a second input RF signal for low-band and provide a second output RF signal.

Filter and matching circuit 330a performs impedance and/or power matching for PA 324a. Filter and matching circuit 330a also filters the first output RF signal from PA 324a to attenuate unwanted harmonics. Similarly, filter and matching circuit 330k performs impedance and/or power matching for PA 324k and also filters the second output RF signal from PA 324k to attenuate unwanted harmonics. Filter and matching circuit 380 performs impedance and/or power matching for ASM 350 and antenna 398. Filter and matching circuit 380 also filters an output RF signal from a selected PA 324 to attenuate unwanted harmonics.

ASM 350 routes an output RF signal from a selected PA 324 toward antenna 398. ASM 350 includes a number of switches 352 that can be operated to (i) route an output RF signal from a selected PA 324 toward antenna 398 and (ii) route a received RF signal from antenna 398 toward a selected LNA (not shown in FIG. 3). Within ASM 350, a switch 352a is coupled between the output of filter and matching circuit 330a and node X, which is the output of ASM 350. A switch 352k is coupled between the output of filter and matching circuit 330k and node X. Other switches are coupled between node X and other circuits (e.g., other PAs and/or LNAs) within wireless device 110. Switches 352 may be implemented with metal oxide semiconductor (MOS) transistors, MOS transmission gates, micro-electro-mechanical system (MEMS) switches, etc.

FIG. 3 also shows an exemplary design of filter and matching circuits 330a, 330k and 380 implemented with an L-topology. The L-topology includes (i) a series circuit component coupled between an input and an output and (ii) a shunt circuit component coupled between the output and circuit ground. In the exemplary design shown in FIG. 3, each filter and matching circuit 330 includes two sections 331 and 341, with each section being implemented with the L-topology. Filter and matching circuit 380 includes one section implemented with the L-topology.

Within filter and matching circuit 330a, first section 331a includes (i) an inductor 332a and a capacitor 334a coupled in parallel and between an input and an output of the first section and (ii) a capacitor 336a and an inductor 338a coupled in series and between the output of the first section and circuit ground. Second section 341a includes (i) an inductor 342a and a capacitor 344a coupled in parallel and between an input and an output of the second section and (ii) a capacitor 346a and an inductor 348a coupled in series and between the output of the second section and circuit ground. The values of inductors 332a, 338a, 342a and 348a and capacitors 334a, 336a, 344a and 346a may be selected to obtain the desired matching for PA 324a and the desired filtering of the first output RF signal from PA 324a. Filter and matching circuit 330a includes four LC pairs—a first LC pair comprising the parallel combination of inductor 332a and capacitor 334a, a second LC pair comprising the series combination of capacitor 336a and inductor 338a, a third LC pair comprising the parallel combination of inductor 342a and capacitor 344a, and a fourth LC pair comprising the series combination of capacitor 346a and inductor 348a.

Each LC pair produces a trap (i.e., a notch response) if that LC pair is considered independently. However, multiple LC pairs typically interact with each other when their resonant frequencies are close together. Hence, the number of traps in an overall frequency response of a filter and matching circuit may be fewer than the number of LC pairs. All LC pairs may be designed together in order to obtain the desired impedance match and harmonic rejection. In simple cases (e.g., with only one trap or two traps that are well separated), the resonance frequency of each LC pair may match a harmonic frequency. In other cases (e.g., when two traps are designed for the same harmonic), the interaction between LC pairs may be considered in order to obtain the desired overall frequency response. The frequency of each trap may or may not match the frequency of a harmonic to be attenuated. Sometimes, a shifted trap may provide sufficient rejection at a harmonic frequency but may produce better in-band performance and/or have other advantages. In general, the values of inductors and capacitors in all LC pairs may be selected such that the desired frequency response and impedance matching can be obtained.

Filter and matching circuit 330k includes four LC pairs and is implemented in similar manner as filter and matching circuit 330a. The values of inductors 332k, 338k, 342k and 348k and capacitors 334k, 336k, 344k and 346k may be selected to obtain the desired matching for PA 324k and the desired filtering of the second output RF signal from PA 324k.

Filter and matching circuit 380 includes (i) an inductor 382 and a capacitor 384 coupled in parallel and between an input and an output of circuit 380 and (ii) a capacitor 386 and an inductor 388 coupled in series and between the output of circuit 380 and circuit ground. Filter and matching circuit 380 includes two LC pairs—a first LC pair comprising the parallel combination of inductor 382 and capacitor 384, and a second LC pair comprising the series combination of capacitor 386 and inductor 388. The values of inductors 382 and 388 and capacitors 384 and 386 may be selected to obtain the desired matching for ASM 350 and antenna 398 and the desired filtering of an output RF signal from a selected PA 324 (e.g., to obtain a desired frequency response that can attenuate all harmonics of interest).

FIG. 3 shows an exemplary design of filter and matching circuits 330a, 330k and 380. A filter and matching circuit may also be implemented with other circuit topologies such as an R topology, a T topology, a Pi topology, etc. The R topology includes (i) a shunt circuit component coupled between an input and circuit ground and (ii) a series circuit component coupled between the input and output. The T topology includes (i) a series circuit component coupled between an input and an intermediate node, (ii) a shunt circuit component coupled between the intermediate node and circuit ground, and (iii) a series circuit component coupled between the intermediate node and an output. The Pi topology includes (i) a shunt circuit component coupled between an input and circuit ground, (ii) a series circuit component coupled between the input and output, and (iii) a shunt circuit component coupled between the output and circuit ground. A filter and matching circuit may also include any number of sections coupled in series and/or in parallel.

FIG. 3 shows an exemplary implementation of PA module 320 and antenna interface circuit 370. In this exemplary implementation, PAs 324, filter and matching circuits 330a and 330k, and ASM 350 within PA module 320 are implemented on the same IC die, which may be referred to as a power amplifier/front-end (PA/FE) die. Filter and matching circuit 380 within antenna interface circuit 370 is implemented on a PCB 312. The IC die implementing PA module 320 may be mounted on an IC package, which may be mounted on PCB 312.

In the exemplary design shown in FIG. 3, attenuation of all second and third harmonics of the second output RF signal for low-band may be implemented on-chip on the IC die implementing PA module 320. This may avoid degradation of the performance of the signal path for high-band. Traps for harmonics of the first output RF signal for high-band may be implemented on PCB 314, e.g., with filter and matching circuit 380 and/or other filter and matching circuits.

As shown in FIG. 3, filter and matching circuits 330a and 330k having lowpass responses and harmonic traps may be placed at the output of PAs 324a and 324k, respectively, and used to reduce the level of harmonics in the output RF signals. However, a wireless device may support a number of bands and/or radio technologies. A large number of circuit components may then be required to implement harmonic traps for different harmonics of each band of interest. The large number of circuit components may be undesirable, especially if these circuit components are external components mounted on a PCB. Furthermore, the harmonic traps may degrade the in-band performance of a signal path, especially if that signal path is shared for multiple bands. For example, a trap for a second harmonic of an output RF signal in a signal path for 850-900 MHz cellular band may strongly filter another output RF signal in 1700-1900 MHz DCS/PCS band if both bands shared the same signal path or part of the same signal path. As another example, a trap for a second harmonic of an output RF signal in 1700-1900 MHz band may cause significant in-band loss for another output RF signal in 2700 MHz band. Switches may be used to separate signal paths for two bands. However, these switches would increase component count and add insertion loss.

Figure 4:
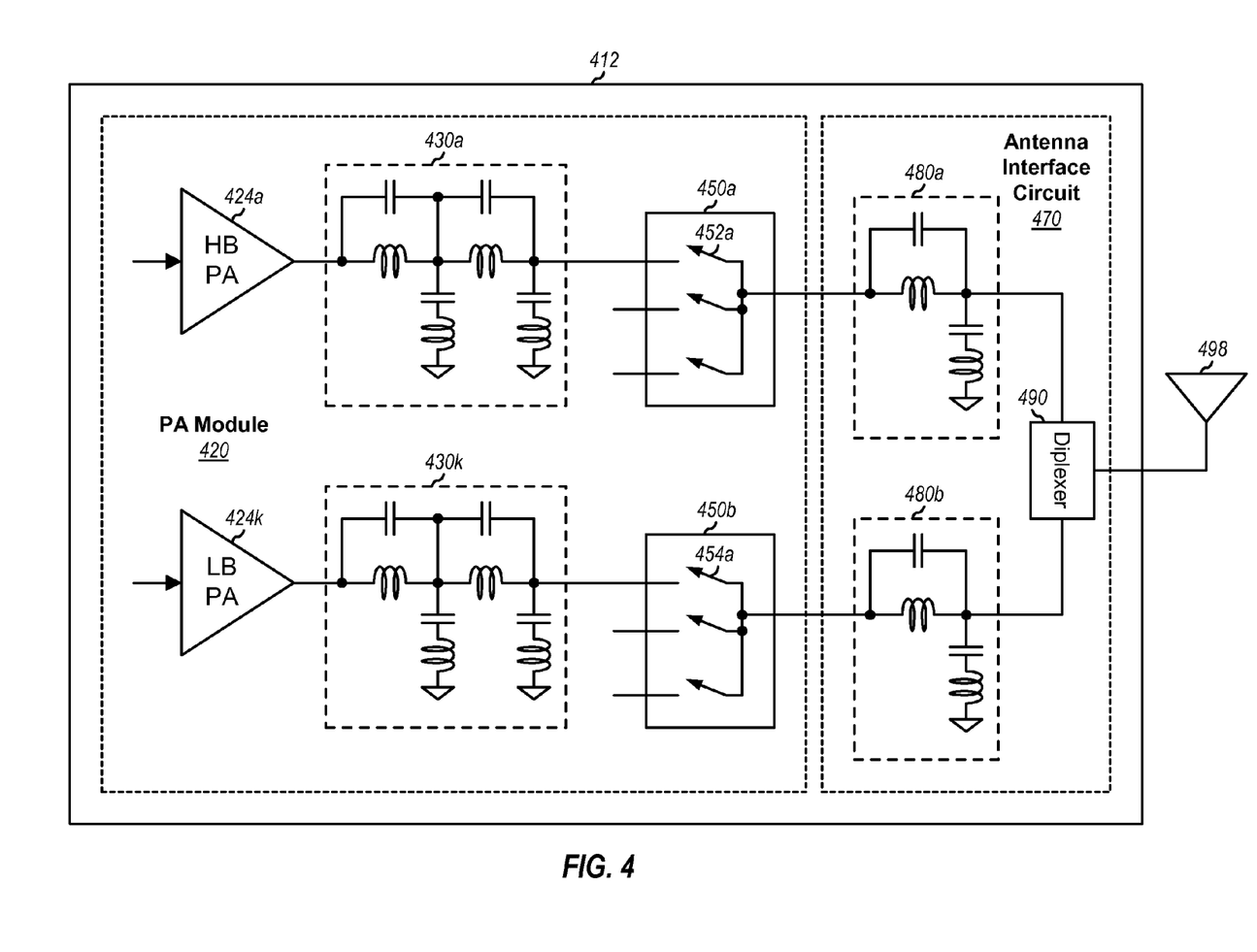
FIG. 4 shows another PA module and another antenna interface circuit.

FIG. 4 shows a PA module 420 and an antenna interface circuit 470, which are another exemplary design of PA module 220 and antenna interface circuit 270 in FIG. 2. For simplicity, FIG. 4 shows PA module 420 including one PA 424a for high-band and one PA 424k for low-band for a particular radio technology. PA module 420 may also include additional PAs to supported additional bands, radio technologies, and/or antennas.

In the exemplary design shown in FIG. 4, PA module 420 includes a filter and matching circuit 430 for each PA 424 as well as an ASM 450 for each band group. Antenna interface circuit 470 includes a filter and matching circuit 480 for each band group and a diplexer 490. Filter and matching circuit 430a is coupled between the output of PA 424a and ASM 450a for high-band. Filter and matching circuit 430k is coupled between the output of PA 424b and ASM 450b for low-band. Filter and matching circuit 480a is coupled between ASM 450a and diplexer 490. Filter and matching circuit 480b is coupled between ASM 450b and diplexer 490. Diplexer 490 is further coupled to an antenna 498.

Filter and matching circuit 430a performs impedance and/or power matching for PA 424a and also filters a first output RF signal from PA 424a to attenuate unwanted harmonics. Filter and matching circuit 430k performs impedance and/or power matching for PA 424k and also filters a second output RF signal from PA 424k to attenuate unwanted harmonics. Filter and matching circuit 480a performs matching for ASM 450a and/or diplexer 490 and also filters an output RF signal for high-band. Filter and matching circuit 480b performs matching for ASM 450b and/or diplexer 490 and also filters an output RF signal for low-band. Diplexer 490 includes (i) a highpass filter that passes the output RF signal for high-band from circuit 480a to antenna 498 and (ii) a lowpass filter that passes the output RF signal for low-band from circuit 480b to antenna 498. Diplexer 490 decouples the signal path for high-band from the signal path for low-band. This decoupling enables harmonic traps to be implemented independently for high-band and low-band. For example, filter and matching circuit 480b may include harmonic traps for second and/or third harmonic of the output RF signal for low-band without affecting the in-band performance of the signal path for high-band. However, more circuit components may be used to implement filter and matching circuits 480a and 480b and diplexer 490.

Filter and matching circuit 430a and 430k may be implemented in similar manner as filter and matching circuits 330a and 330k, respectively, in FIG. 3. Filter and matching circuits 480a and 480b may each be implemented in similar manner as filter and matching circuit 380 in FIG. 3. The values of inductors and capacitors in filter and matching circuits 430a and 480a may be selected to obtain the desired performance for high-band. The values of inductors and capacitors in filter and matching circuits 430k and 480b may be selected to obtain the desired performance for low-band.

FIG. 4 also shows an exemplary implementation of PA module 420 and antenna interface circuit 470. In this exemplary implementation, PAs 424, filter and matching circuits 430a and 430k, and ASMs 450a and 450k within PA module 420 are implemented on the same IC die. Filter and matching circuits 480a and 480b and diplexer 490 within antenna interface circuit 470 are implemented on a PCB 412, which includes the IC die for PA module 420.

In an aspect of the present disclosure, circuit components in an unselected signal path may be reused to implement a filter for a selected signal path. Reusing circuit components in the unselected/unused signal path to implement the filter for the selected/used signal path may improve performance (e.g., provide more attenuation of undesired harmonics) while reducing the number of circuit components needed to implement the filter.

Figure 5A:
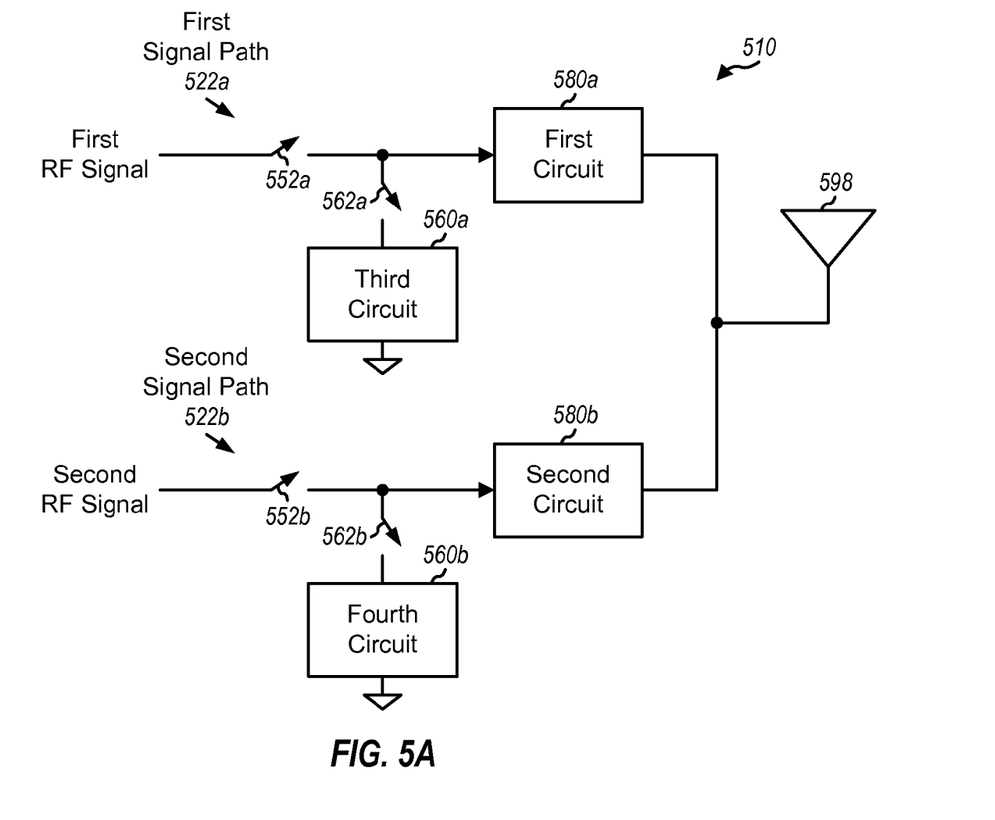
FIG. 5A shows a transmitter that reuses circuit components in an unselected signal path to implement a filter for a selected signal path.

FIG. 5A shows an exemplary design of a transmitter 510 that reuses circuit components in an unselected signal path to implement a filter for a selected signal path. In the exemplary design shown in FIG. 5A, transmitter 510 includes (i) a first signal path 522a comprising a first switch 552a and a first circuit 580a coupled to an antenna 598 (ii) a second signal path 522b comprising a second switch 552b and a second circuit 580b coupled to antenna 598. First circuit 580a may perform impedance and/or power matching for the first signal path 522a. Second circuit 580b may perform impedance and/or power matching for the second signal path 522b. Circuits 580a and 580b may each comprise one or more inductors, one or more capacitors, and/or other circuit components.

Transmitter 510 further includes (i) a third circuit 560a selectively coupled to the first signal path 522a via a switch 562a and (ii) a fourth circuit 560b selectively coupled to the second signal path 522b via a switch 562b. Circuits 560a and 560b may each comprise one or more capacitors and/or other circuit components.

Figure 5B:
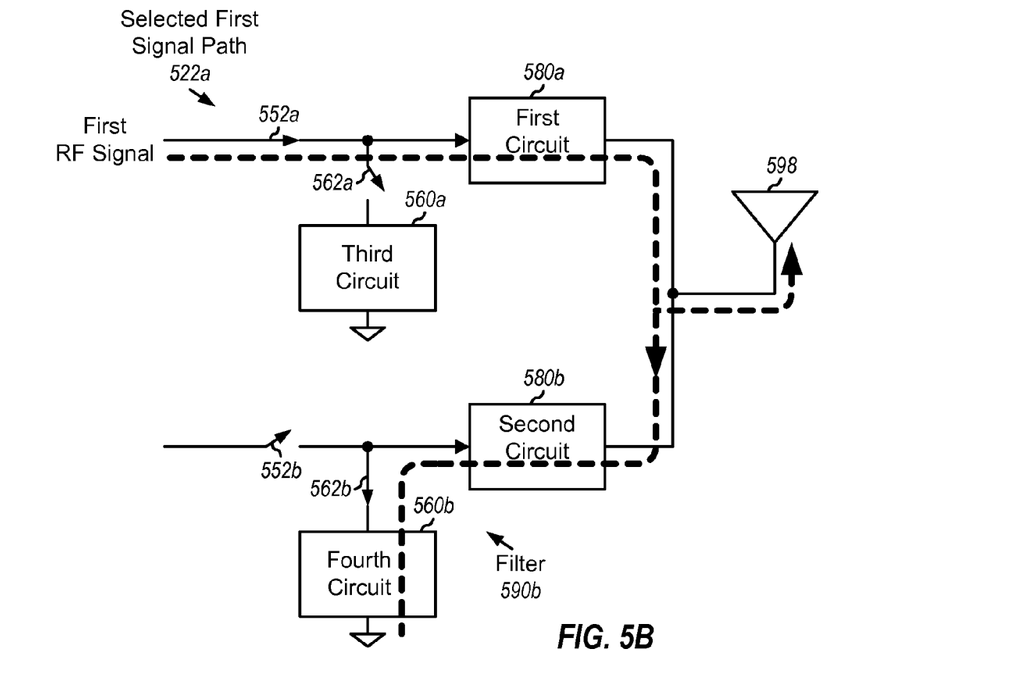
FIGS. 5B and 5C show operation of the transmitter in FIG. 5A.

FIG. 5B shows operation of transmitter 510 in FIG. 5A with the first signal path 522a selected and the second signal path 522b unselected. In this case, switches 552a and 562b are closed, and switches 552b and 562a are opened. A first RF signal (e.g., from a first PA not shown in FIG. 5B) is passed through first circuit 580a and provided to antenna 598. A filter 590b is formed by second circuit 580b and fourth circuit 560b and may be used to attenuate undesired harmonics in the first RF signal. Fourth circuit 560b may include one or more adjustable circuit components (e.g., an adjustable capacitor) that can be varied to obtain a desired frequency response for filter 590b.

Figure 5C:
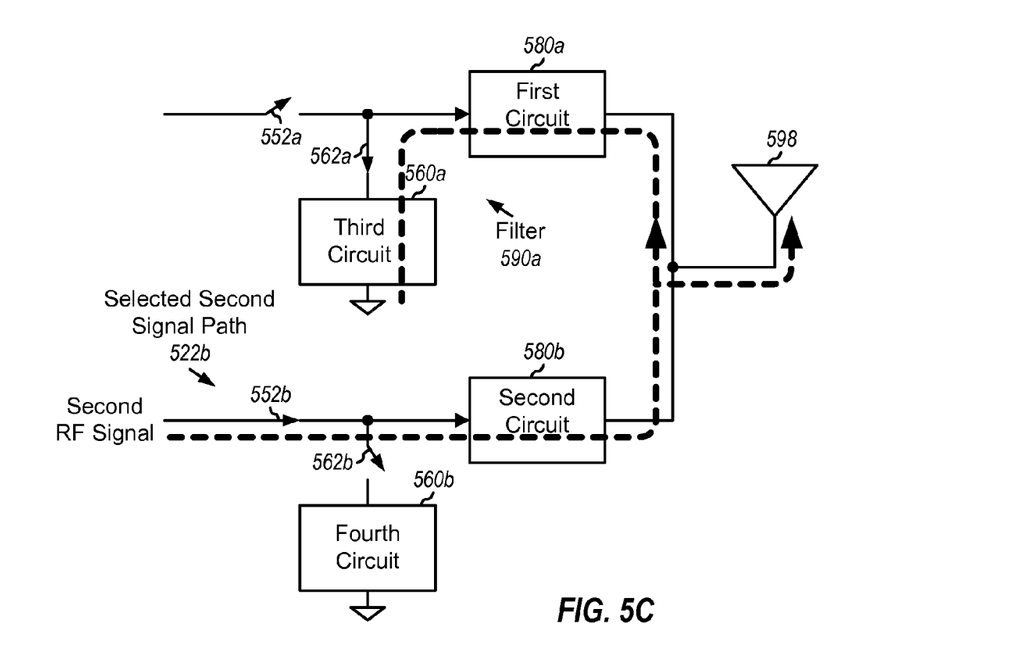

FIG. 5C shows operation of transmitter 510 in FIG. 5A with the second signal path 522b selected and first signal path 522a unselected. In this case, switches 552b and 562a are closed, and switches 552a and 562b are opened. A second RF signal (e.g., from a second PA not shown in FIG. 5C) is passed through second circuit 580b and provided to antenna 598. A filter 590a is formed by first circuit 580a and third circuit 560a and may be used to attenuate undesired harmonics in the second RF signal. Third circuit 560a may include one or more adjustable circuit components (e.g., an adjustable capacitor) that can be varied to obtain a desired frequency response for filter 590a.

Figure 6:
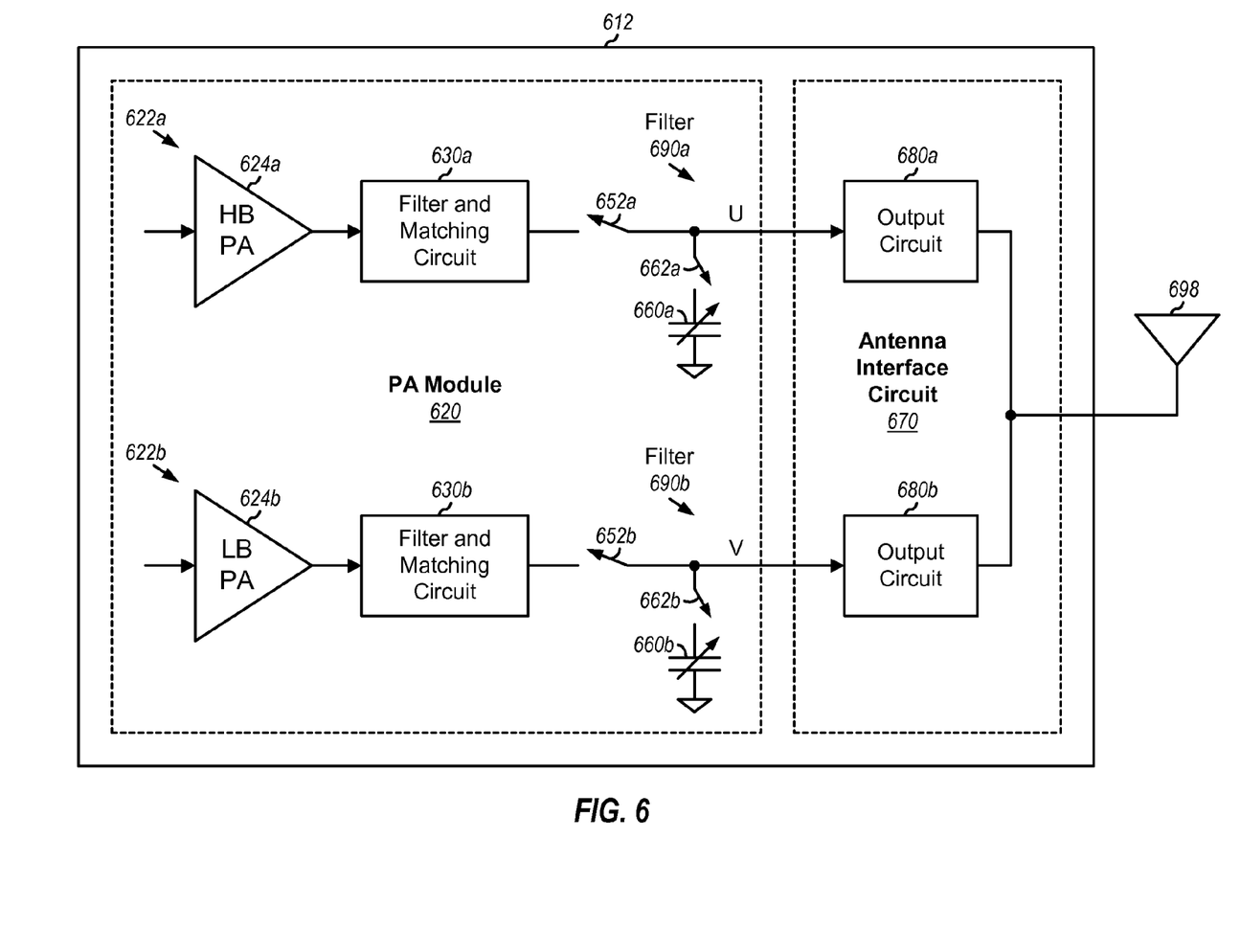
FIGS. 6 to 8 show three exemplary designs of a PA module and an antenna interface circuit that reuse circuit components in an unselected signal path to implement a filter for a selected signal path.

FIG. 6 shows an exemplary design of a PA module 620 and an antenna interface circuit 670, which reuse circuit components in an unselected signal path to implement a filter for a selected signal path. PA module 620 and antenna interface circuit 670 are another exemplary design of PA module 220 and antenna interface circuit 270 in FIG. 2.

In the exemplary design shown in FIG. 6, PA module 620 includes (i) a first transmit path 622a comprising a PA 624a, a filter and matching circuit 630a, and a switch 652a coupled in series and (ii) a second transmit path 622b comprising a PA 624b, a filter and matching circuit 630b, and a switch 652b coupled in series. Filter and matching circuits 630a and 630b may perform matching for PAs 624a and 624b, respectively, and may also filter output RF signals from PAs 624a and 624b to attenuate unwanted harmonics. Filter and matching circuit 630a and 630b may each be implemented in similar manner as filter and matching circuit 330a or 380 in FIG. 3 or based on other circuit designs.

In the exemplary design shown in FIG. 6, antenna interface circuit 670 includes (i) an output circuit 680a coupled between node U in the first transmit path 622a and an antenna 698 and (ii) an output circuit 680b coupled between node V in the second transmit path 522b and antenna 698.

Nodes U and V may correspond to points in the first and second signal paths at the output of PA module 620. Output circuit 680a may perform impedance and/or power matching for the first signal path 622a (e.g., for switch 652a) and antenna 698. Output circuit 680b may perform impedance and/or power matching for the second transmit path 622b (e.g., for switch 652b) and an antenna 698. Each output circuit 680 may include an inductor coupled in series between an input and an output of the output circuit. Each output circuit 680 may also include a series capacitor, one or more shunt circuit components at the input, one or more shunt circuit components at the output, and/or other circuit components.

In the exemplary design shown in FIG. 6, PA module 620 further includes (i) an adjustable capacitor 660a selectively coupled between node U in the first transmit path 622a and circuit ground via a switch 662a and (ii) an adjustable capacitor 660b selectively coupled between node V in the second transmit path 622b and circuit ground via a switch 662b. Each adjustable capacitor 660 can be connected to, or disconnected from, node U or V via the associated switch 662. Each adjustable capacitor 660 has a capacitance that can be adjusted. In an exemplary design, each adjustable capacitor 660 may be implemented with a bank of switchable capacitors, with each switchable capacitor being coupled in series with an associated switch. Each switchable capacitor may be selected by closing the associated switch or unselected by opening the associated switch. The switchable capacitors in the bank may have the same value or different values. A desired capacitance may be obtained by selecting one or more switchable capacitors in the bank. In another exemplary design, each adjustable capacitor 660 may be implemented with a variable capacitor (varactor) having a capacitance that can be varied by a control voltage.

Transmit paths 622a and 622b may be designed for different band groups (e.g., high-band and low-band) or different radio technologies. Since transmit paths 622a and 622b share the same antenna 698, only one transmit path 622a or 622b may be selected at any given moment, and the other transmit path may be unselected.

If the first transmit path 622a is selected, then switches 652a and 662b are closed, and switches 652b and 662a are opened. A first input RF signal is amplified by PA 624a to obtain a first output RF signal, which is passed through filter and matching circuit 630a, switch 652a, and output circuit 680a and provided to antenna 698. A filter 690b is formed by output circuit 680b and adjustable capacitor 660b and may be used to attenuate undesired harmonics in the first output RF signal. Adjustable capacitor 660b may be varied to obtain a desired frequency response for filter 690b.

If the second transmit path 622b is selected, then switches 652b and 662a are closed, and switches 652a and 662b are opened. A second input RF signal is amplified by PA 624b to obtain a second output RF signal, which is passed through filter and matching circuit 630b, switch 652b, and output circuit 680b and provided to antenna 698. A filter 690a is formed by output circuit 680a and adjustable capacitor 660a and may be used to attenuate undesired harmonics in the second output RF signal. Adjustable capacitor 660a may be varied to obtain a desired frequency response for filter 690a.

FIG. 6 shows an exemplary design in which adjustable capacitors 660a and 660b are selectively coupled to first and second transmit paths 622a and 622b, respectively. In another exemplary design, only one adjustable capacitor (e.g., either adjustable capacitor 660a or 660b) may be selectively coupled to one transmit path via an associated switch. Only one filter 690a or 690b may be formed for one transmit path 622a or 622b having more stringent requirements for its output RF signal.

Figure 7:
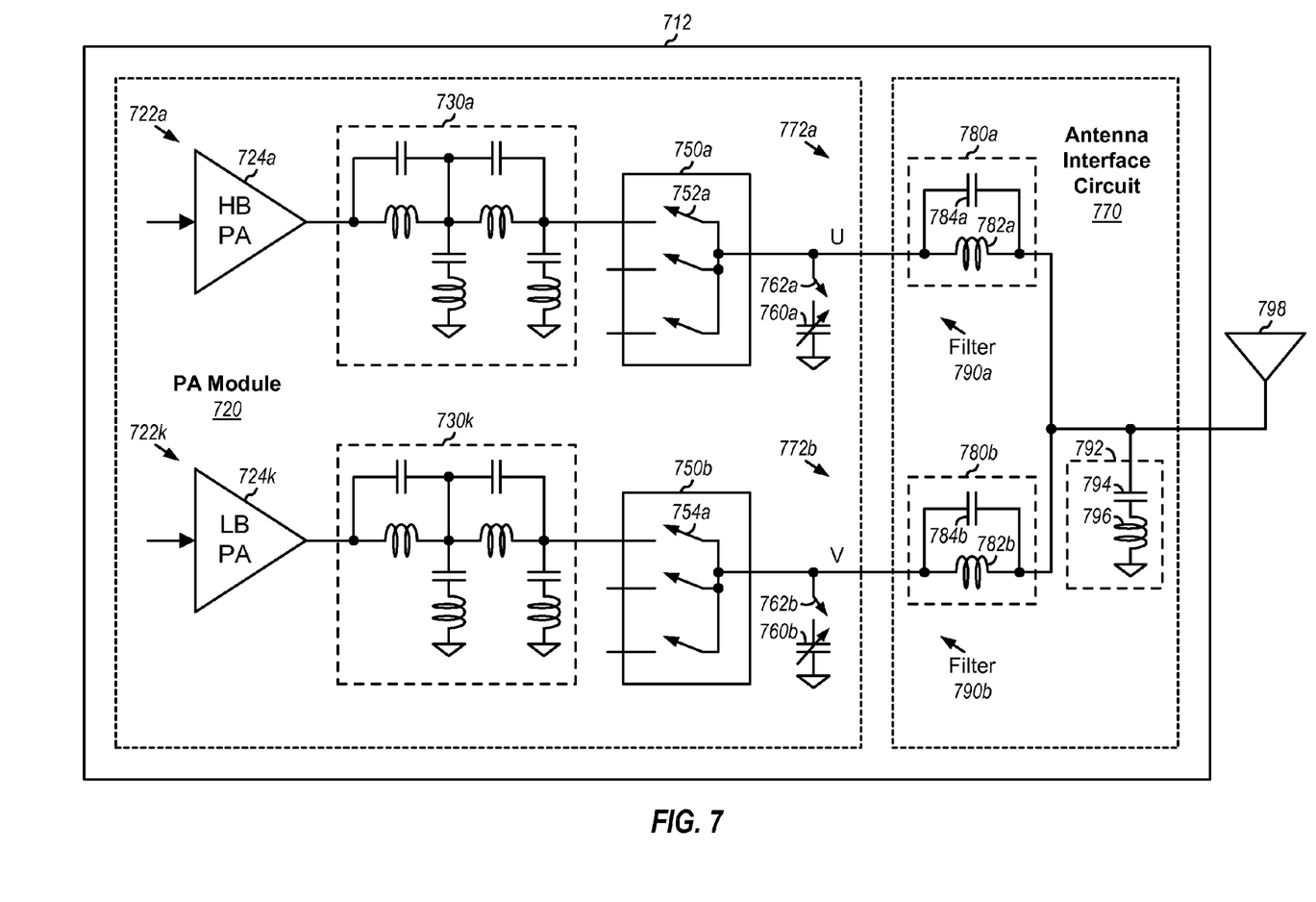

FIG. 7 shows an exemplary design of a PA module 720 and an antenna interface circuit 770, which is another exemplary design of PA module 220 and antenna interface circuit 270 in FIG. 2. In the exemplary design shown in FIG. 7, PA module 720 includes (i) a first transmit path 722a comprising a PA 724a and a filter and matching circuit 730a and (ii) a second transmit path 722k comprising a PA 724k and a filter and matching circuit 730k. PA module 720 may also include additional transmit paths formed with additional PAs and filter and matching circuits to supported additional bands, radio technologies, and/or antennas.

In the exemplary design shown in FIG. 7, PA module 720 and antenna interface circuit 770 include (i) a first output path 772a for high-band and comprising an ASM 750a and an output circuit 780a coupled to an antenna 798 and (ii) a second output path 772b for low-band and comprising an ASM 750b and an output circuit 780b coupled to antenna 798. Multiple transmit paths 722 for different radio technologies and/or different bands in high-band may be multiplexed to the first output path 772a for high-band via switches 752 within ASM 750a. Similarly, multiple transmit paths 722 for different radio technologies and/or different bands in low-band may be multiplexed to the second output path 772b for low-band via switches 754 within ASM 750b. Additional output paths may also be implemented with additional ASMs and output circuits to supported additional band groups, radio technologies, and/or antennas.

In the exemplary design shown in FIG. 7, an adjustable capacitor 760a is selectively coupled between the output of ASM 750a at node U and circuit ground via a switch 762a. An adjustable capacitor 760b is selectively coupled between the output of ASM 750b at node V and circuit ground via a switch 762b. A filter 792 is coupled between antenna 798 and circuit ground.

Filter and matching circuit 730a performs impedance and/or power matching for PA 724a and also filters a first output RF signal from PA 724a to attenuate unwanted harmonics. Filter and matching circuit 730k performs impedance and/or power matching for PA 724k and also filters a second output RF signal from PA 724k to attenuate unwanted harmonics. Output circuit 780a performs matching for ASM 750a and/or antenna 798. Output circuit 780b performs matching for ASM 750b and/or antenna 798. Filter 792 operates as a harmonic trap for high-band and/or a higher-order trap for low-band.

Filter and matching circuit 730a and 730k may be implemented in similar manner as filter and matching circuits 730a and 730k, respectively, in FIG. 3. In the exemplary design shown in FIG. 7, output circuit 780a is implemented with an inductor 782a and a capacitor 784a coupled in parallel between an input and an output of circuit 780a. Output circuit 780b is implemented with an inductor 782b and a capacitor 784a coupled in parallel between an input and an output of circuit 780b. Filter 792 is implemented with a capacitor 794 and an inductor 796 coupled in series between antenna 798 and circuit ground. Filter and matching circuits 730a and 730k, output circuits 780a and 780b, and filter 792 may also be implemented in other manners, e.g., with other circuit topologies, different number of sections, etc. For example, filter 792 may be implemented with only capacitor 794 coupled between antenna 798 and circuit ground. The values of the inductors and capacitors in circuits 730a and 780a may be selected to obtain the desired performance for high-band. The values of the inductors and capacitors in circuits 730k and 780b may be selected to obtain the desired performance for low-band.

Inductor 782a may be selected to obtain the desired matching between switches 752 and antenna 798. Similarly, inductor 782b may be selected to obtain the desired matching between switches 754 and antenna 798. There may be some flexibility in choosing the values of inductors 782a and 782b, since multiple values may produce similar results. Large values of inductors 782a and 782b may reduce the values of capacitors 760a and 760b, which may reduce parasitic/off capacitance and increase quality factor (Q) for a given circuit area. Capacitors 760a and 760b may be selected to resonate inductors 782a and 782b, respectively, at a desired harmonic frequency. Inductors 782a and 782b and capacitors 760a and 760b may also be selected based on a trade-off between the performance of different bands and/or radio technologies (e.g., LTE, WCDMA, GSM, etc.) sharing the same output path. The techniques described herein provide an additional level of freedom in the design of a PA module and an antenna interface circuit.

FIG. 7 shows an exemplary implementation of PA module 720 and antenna interface circuit 770. In this exemplary implementation, PAs 724, filter and matching circuits 730, ASMs 750, and adjustable capacitors 760 within PA module 720 are implemented on the same IC die. Output circuits 780 and filter 790 within antenna interface circuit 770 are implemented on a PCB 712 on which the IC die for PA module 720 is mounted.

One signal path comprising one transmit path 722 and one output path 772 may be selected at any given moment, and the remaining transmit paths and output paths may be unselected. Switches 752 and 754 may be opened for all transmit paths except for the selected transmit path. Switch 762 for the selected output path may be opened, and switch 762 for one unselected output path may be closed.

When a signal path comprising transmit path 722a and output path 772a for high-band is selected, switches 752a and 762b are closed, and all other switches are opened. A first input RF signal for high-band is amplified by PA 724a to obtain a first output RF signal, which is passed through filter and matching circuit 730a, switch 752a, and output circuit 780a and provided to antenna 798. A filter 790b is formed by output circuit 780b and adjustable capacitor 760b and may be used to attenuate undesired harmonics in the first output RF signal for high-band. Inductor 782b in unselected output path 772b is reused to implement filter 790b for selected output path 772a. Adjustable capacitor 760b may be varied to obtain a desired frequency response for filter 790b.

When a signal path comprising transmit path 722k and output path 772b for low-band is selected, switches 754a and 762a are closed, and all other switches are opened. A second input RF signal for low-band is amplified by PA 724k to obtain a second output RF signal, which is passed through filter and matching circuit 730k, switch 754a, and output circuit 780b and provided to antenna 798. A filter 790a is formed by output circuit 780a and adjustable capacitor 760a and may be used to attenuate undesired harmonics in the second output RF signal for low-band. Inductor 782a in unselected output path 772a is reused to implement filter 790a for selected output path 772b. Adjustable capacitor 760a may be varied to obtain a desired frequency response for filter 790a.

Figure 8:
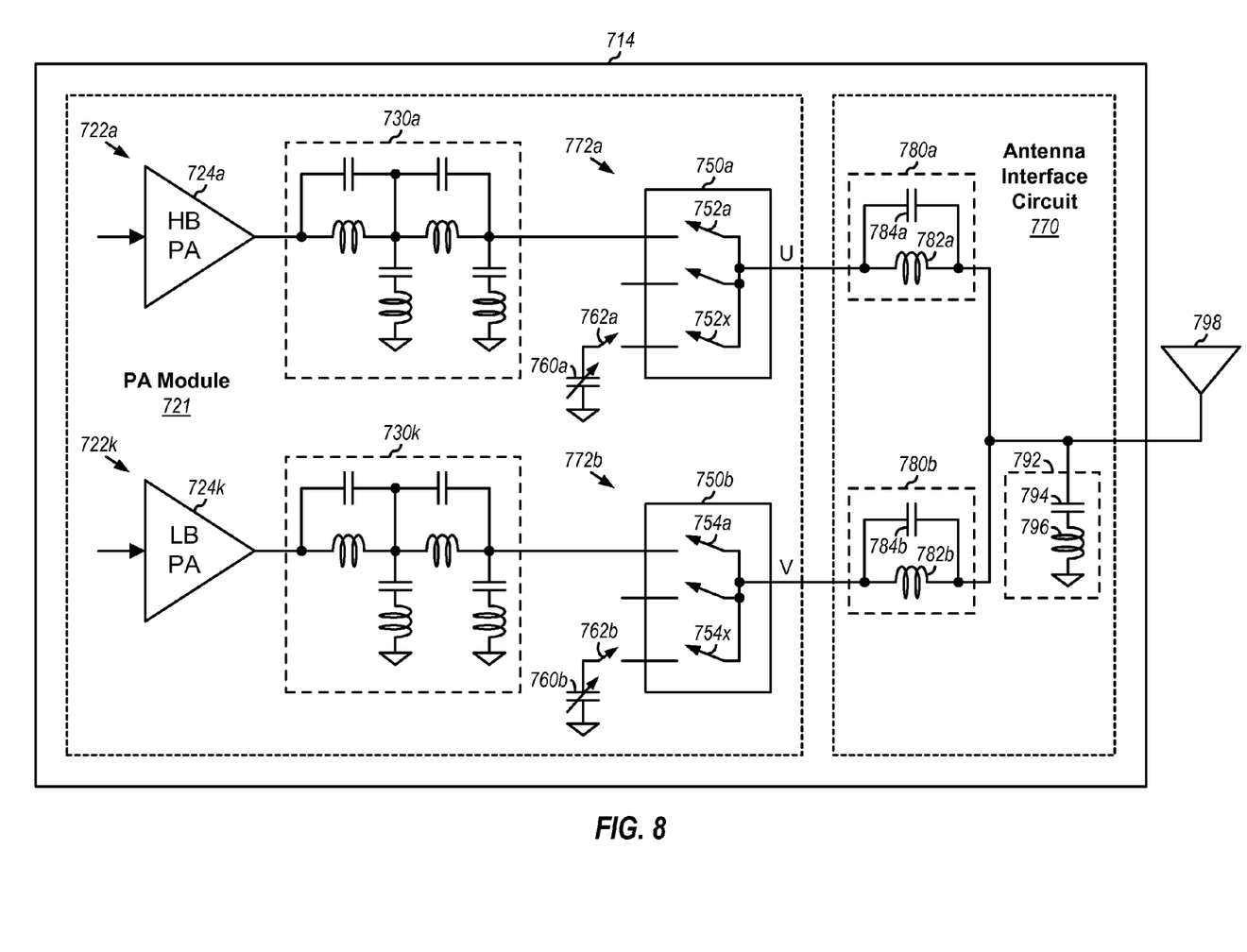

FIG. 8 shows an exemplary design of a PA module 721, which is another exemplary design of PA module 220 in FIG. 2. In the exemplary design shown in FIG. 8, PA module 721 includes all of the circuit components in PA module 720 in FIG. 7. However, the series combination of switch 762a and adjustable capacitor 760a are coupled to a switch 752x within ASM 750a (instead of node U as shown in FIG. 7). Similarly, the series combination of switch 762b and adjustable capacitor 760b are coupled to a switch 754x within ASM 750b (instead of node V as shown in FIG. 7).

Placing adjustable capacitor 760a at node U (as shown in FIG. 7) may result in a parasitic capacitance at node U when capacitor 760a is disconnected from node U. This parasitic capacitance may increase the insertion loss of the first output path 772a. The parasitic capacitance and insertion loss on the first output path 772a may be reduced by placing adjustable capacitor 760a before ASM 750a and coupling capacitor 760a to node U via switch 752x, as shown in FIG. 8. Switch 752x may have reduced off capacitance and higher resistance, which may result in a smaller insertion loss of the first output path 772a. The same benefits may be obtained by placing adjustable capacitor 760b before ASM 750b and coupling capacitor 760b to node V via switch 754x within ASM 750b.

The techniques described herein for reusing circuit components in an unselected signal path to implement a filter for a selected signal path may provide various advantages. First, additional filtering may be achieved for an RF signal in the selected path, which may improve performance. The filter may be adjustable (e.g., may include an adjustable harmonic trap) and may cover multiple bands, e.g., DCS-PCS band, CELL-EGSM band, etc. Second, the filter may be implemented with few additional circuit components. An inductor (which may be more costly to implement) for the unselected path may be reused to implement the filter. Third, no additional input/output (I/O) pins/pads are needed on an IC to implement the filter. The filter may have other advantages.

In an exemplary design, an apparatus (e.g., a wireless device, an IC, a circuit module, a printed circuit board, etc.) may comprise first, second and third circuits. The first circuit (e.g., first circuit 580a in FIG. 5A or output circuit 780a in FIG. 7) may pass a first RF signal to an antenna when a first signal path is selected. The second circuit (e.g., second circuit 580b in FIG. 5A or output circuit 780b in FIG. 7) may pass a second RF signal to the antenna when a second signal path is selected. The third circuit (e.g., third circuit 560a in FIG. 5A or capacitor 760a in FIG. 7) may operate with the first circuit to form a filter for the second RF signal when the second signal path is selected and the first signal path is unselected (e.g., as shown in FIG. 5C). The third circuit may be selectively coupled to the first circuit (e.g., via a switch) when the second signal path is selected. The third circuit may be disconnected from the first circuit when the first signal path is selected.

The apparatus may further comprise a fourth circuit (e.g., fourth circuit 560b in FIG. 5A or capacitor 760b in FIG. 7), which may operate with the second circuit to form a second filter for the first RF signal when the first signal path is selected and the second signal path is unselected (e.g., as shown in FIG. 5B). The fourth circuit may be selectively coupled to the second circuit (e.g., via a switch) when the first signal path is selected. The fourth circuit may be disconnected from the second circuit when the second signal path is selected.

In an exemplary design, the first circuit may comprise an inductor (e.g., inductor 782a in FIG. 7) coupled between an input and an output of the first circuit. The third circuit may comprise a capacitor (e.g., capacitor 760a) coupled to circuit ground. The capacitor may have an adjustable value (e.g., as shown in FIG. 7) or a fixed value. The filter may have a notch to attenuate a harmonic of the second RF signal when the second signal path is selected.

The apparatus may further comprise an ASM (e.g., ASM 750a in FIGS. 7 and 8) coupled to the first circuit. The ASM may pass the first RF signal to the first circuit when the first signal path is selected. In one exemplary design, the third circuit may be selectively coupled between an output of the ASM and circuit ground, e.g., as shown in FIG. 7. In another exemplary design, the third circuit may be selectively coupled between an input of the ASM and circuit ground, e.g., as shown in FIG. 8.

The apparatus may comprise first and second PAs. The first PA (e.g., PA 724a in FIG. 7) may provide the first RF signal when the first PA is selected. The second PA (e.g., PA 724k in FIG.) may provide the second RF signal when the second PA is selected. The apparatus may further comprise first and second filter and matching circuits. The first filter and matching circuit (e.g., circuit 730a in FIG. 7) may be coupled to the first PA and may filter the first RF signal when the first PA is selected. The second filter and matching circuit (e.g., circuit 730k in FIG. 7) may be coupled to the second PA and may filter the second RF signal when the second PA is selected. The apparatus may further comprise first and second ASMs. The first ASM (e.g., ASM 750a in FIG. 7) may be coupled to the first filter and matching circuit and may pass the first RF signal when the first PA is selected. The second ASM (e.g., ASM 750b in FIG. 7) may be coupled to the second filter and matching circuit and may pass the second RF signal when the second PA is selected. The apparatus may further comprise additional PAs, filter and matching circuits, ASMs, etc.

In an exemplary design, the first and second circuits may be implemented on a printed circuit board. The third circuit may be implemented on an IC that is mounted on the printed circuit board. The circuits may also be implemented in other manners. In an exemplary design, the first and second circuits may be coupled directly to the antenna (e.g., as shown in FIGS. 5A, 6, 7 and 8) without going through a diplexer. In another exemplary design, the first and second circuits may be coupled to the antenna via one or more circuits, which may comprise a diplexer, switches, etc.

In an exemplary design, the first and second signal paths may be for different bands or different band-groups. For example, the first signal path may be for a first band group (e.g., high-band), and the second signal path may be for a second band group (e.g., low-band). In another exemplary design, the first and second signal paths may be for different radio technologies.

Figure 9:
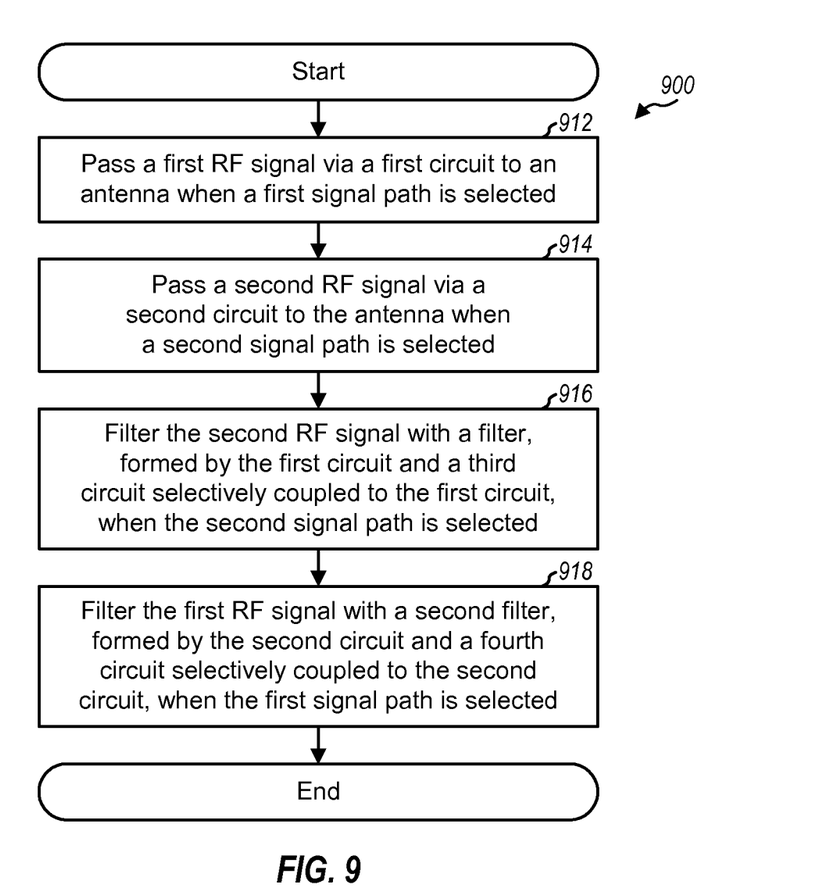
FIG. 9 shows a process for transmitting a signal.

FIG. 9 shows an exemplary design of a process 900 for transmitting a signal. A first RF signal may be passed via a first circuit to an antenna when a first signal path is selected, e.g., as shown in FIG. 5B (block 912). A second RF signal may be passed via a second circuit to the antenna when a second signal path is selected, e.g., as shown in FIG. 5C (block 914). The second RF signal may be filtered with a filter when the second signal path is selected and the first signal path is unselected (block 916). The filter may be formed by the first circuit and a third circuit, which may be selectively coupled to the first circuit, e.g., as shown in FIG. 5C. The first RF signal may be filtered with a second filter when the first signal path is selected and the second signal path is unselected (block 918). The second filter may be formed by the second circuit and a fourth circuit, which may be selectively coupled to the second circuit, e.g., as shown in FIG. 5B.

The circuits and filters described herein may be implemented on one or more ICs, analog ICs, RFICs, mixed-signal ICs, ASICs, PCBs, electronic devices, etc. The circuits and filters may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuits and/or filters described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:
1. An apparatus comprising:
a first circuit configured to pass a first radio frequency (RF) signal on a first signal path to an antenna when a first signal path is selected;
a second circuit configured to pass a second RF signal on a second signal path to the antenna when a second signal path is selected;

a third circuit configured to operate with at least a reactive portion of the first signal path of the first circuit in shunt with the antenna to form a filter for the second RF signal when the second signal path is selected; and a switch coupled between the first signal path and circuit ground and configured to selectively couple the third circuit to the first signal path.

2. The apparatus of claim 1, further comprising:
a fourth circuit configured to operate with the second circuit to form a second filter for the first RF signal when the first signal path is selected.

3. The apparatus of claim 1, the third circuit being disconnected from the first signal path when the first signal path is selected.

4. The apparatus of claim 1, the first circuit comprising an inductor coupled between an input and an output of the first circuit, and the third circuit comprising a capacitor coupled to circuit ground.

5. The apparatus of claim 4, the capacitor having an adjustable value.

6. The apparatus of claim 1, the filter having a notch to attenuate a harmonic of the second RF signal when the second signal path is selected.

7. The apparatus of claim 1, further comprising:
an antenna switch matrix (ASM) coupled to the first circuit and configured to pass the first RF signal to the first circuit when the first signal path is selected.

8. The apparatus of claim 7, the third circuit being selectively coupled at an output of the ASM.

9. The apparatus of claim 7, the third circuit being selectively coupled at an input of the ASM.

10. The apparatus of claim 1, further comprising:
a first power amplifier (PA) configured to provide the first RF signal when the first PA is selected; and
a second PA configured to provide the second RF signal when the second PA is selected.

11. The apparatus of claim 10, further comprising:
a first filter and matching circuit coupled to the first PA and configured to filter the first RF signal when the first PA is selected; and
a second filter and matching circuit coupled to the second PA and configured to filter the second RF signal when the second PA is selected.

12. The apparatus of claim 11, further comprising:
a first antenna switch matrix (ASM) coupled to the first filter and matching circuit and configured to pass the first RF signal when the first PA is selected; and
a second ASM coupled to the second filter and matching circuit and configured to pass the second RF signal when the second PA is selected.

13. The apparatus of claim 1, the first and second circuits being coupled to the antenna without going through a diplexer.

14. The apparatus of claim 1, the first and second circuits being implemented on a printed circuit board, and the third circuit being implemented on an integrated circuit mounted on the printed circuit board.

15. The apparatus of claim 1, the first signal path being for a first band group, and the second signal path being for a second band group.

16. The apparatus of claim 1, the first signal path being for high-band, and the second signal path being for low-band.

17. A method comprising:
passing a first radio frequency (RF) signal via a first circuit on a first signal path to an antenna when a first signal path is selected;
decoupling a third circuit from the first signal path when the first signal path is selected;
passing a second RF signal via a second circuit on a second signal path to the antenna when a second signal path is selected;
coupling the third circuit to the first signal path when the second signal path is selected; and
filtering the second RF signal with a filter, formed by at least a reactive portion of the first signal path of the first circuit in shunt with the antenna and the third circuit, when the second signal path is selected.

18. The method of claim 17, further comprising:
filtering the first RF signal with a second filter, formed by the second circuit and a fourth circuit, when the first signal path is selected.

19. An apparatus comprising:
first means for passing a first radio frequency (RF) signal on a first signal path to an antenna when a first signal path is selected;
second means for passing a second RF signal on a second signal path to the antenna when a second signal path is selected; and
means for filtering the second RF signal when the second signal path is selected, the means for filtering being formed based on at least a reactive portion of the first signal path of the first means for passing in shunt with the antenna and a circuit means selectively coupled to the first means for passing; and
means for selectively coupling the circuit means to the first means for passing, the means for selectively coupling being coupled between the first means for passing and ground.

20. The apparatus of claim 19, further comprising:
means for filtering the first RF signal when the first signal path is selected, the means for filtering the first RF signal being formed based on the second means for passing and a second circuit means selectively coupled to the second means for passing.

* * * * *